United States Patent [19]

Deschenaux et al.

[11] Patent Number: 4,534,047
[45] Date of Patent: Aug. 6, 1985

[54] MASK RING ASSEMBLY FOR X-RAY LITHOGRAPHY

[75] Inventors: Warren Deschenaux, Shelton; Gregory Hughes, Norwalk; Justin Kreuzer, Trumbull; Carlo La Fiandra, New Canaan, all of Conn.

[73] Assignee: The Perkin-Elmer Corporation, Norwalk, Conn.

[21] Appl. No.: 568,776

[22] Filed: Jan. 6, 1984

[51] Int. Cl.³ .......................... G03B 11/00; G02B 7/00; G03F 5/00
[52] U.S. Cl. .................... 378/35; 250/482.1; 350/318
[58] Field of Search ................. 378/34, 35; 250/492.3, 250/475.2, 482.1; 350/318

[56] References Cited

U.S. PATENT DOCUMENTS

| | | | |
|---|---|---|---|
| 3,743,842 | 7/1973 | Smith et al. | 378/35 |
| 3,892,973 | 7/1975 | Coquin et al. | 250/505 |
| 4,037,111 | 7/1977 | Coquin et al. | 250/514 |
| 4,085,329 | 4/1978 | McCoy et al. | 250/491 |
| 4,185,202 | 1/1980 | Dean et al. | 250/492 A |
| 4,187,431 | 2/1980 | Hundt | 250/272 |
| 4,215,192 | 7/1980 | Buckley | 430/270 |
| 4,238,682 | 12/1980 | Vratny | 250/420 |
| 4,301,237 | 11/1981 | Burns | 430/394 |
| 4,335,313 | 1/1982 | Kreuzer et al. | 250/491 |

Primary Examiner—Richard L. Schilling
Attorney, Agent, or Firm—Thomas P. Murphy; Edwin T. Grimes; Francis L. Masselle

[57] ABSTRACT

This invention is directed to a mask ring assembly for X-ray lithography which is particularly adapted, among other possible uses, for use in replicating integrated circuit patterns, said assembly including a mask ring, a plurality of kinematic mounts for removably mounting the mask ring on an alignment cartridge, each of the kinematic mounts including a funnel-like shaped seat member and a mating ball-like shaped member, one of said members being on the mask ring and the other of the members being mounted on the alignment cartridge.

11 Claims, 4 Drawing Figures

MASK RING ASSEMBLY FOR X-RAY LITHOGRAPHY

FIELD OF THE INVENTION

This invention is directed to lithography systems and, more particularly, to a new and improved mask ring assembly for use in X-ray lithographic systems. X-ray lithographic systems constructed according to the concepts of the present invention are particularly adapted, among other possible uses, for use in the replicating of integrated circuit patterns.

This application is closely related to U.S. Pat. application Ser. No. 568,777 filed Jan. 6, 1984 entitled "X-ray Anode Assembly", and U.S. Pat. application Ser. No. 568,775 filed Jan. 6, 1984 entitled "X-ray Lithography System", and U.S. Pat. application Ser. No. 568,778 filed Jan. 6, 1984 entitled "An X-ray Mask Ring Assembly and Apparatus for Making Same"). All of said applications are being filed on even date herewith and are assigned to the same assignee. The disclosures contained in said applications are incorporated herein by reference.

BACKGROUND OF INVENTION

X-ray lithography is a proximity patterning technique. A gold pattern X-ray mask is used to selectively absorb and transmit soft X-rays for exposing a resist-coated wafer held in close proximity to the mask. The X-ray mask itself comprises a thin substrate of BN, SiC, or Ti that is supported by a rigid mounting ring. The gold mask absorber pattern is formed by etching a 7000 angstrum thick, gold film deposited on the substrate or by a special, low stress gold plating process.

Soft seven angstrum X-rays are generated by a high-power source, a water-cooled rotating anode and an electron gun located together in a vacuum chamber. X-rays are generated by focusing the hollow, coned-shaped beam of electrons onto the rotating tungsten surface of the anode. The cylindrical, high-powered electron gun allows the X-rays generated in a small diameter spot to pass through it. This diverging cone of X-ray radiation then passes through a thin beryllium vacuum window into a helium filled exposure chamber. The mask and wafer are closely aligned prior to insertion into the exposure chamber, and maintained during exposure.

While mask ring assemblies heretofore proposed met with reasonable success, the present invention is directed to improvements in such systems, as will be become apparent as the description proceeds.

Related patents in this field include inter alia: U.S. Pat. No. 3,743,842 issued July 3, 1973; U.S. Pat. No. 3,892,973 issued July 1, 1975; U.S. Pat. No. 4,037,111 issued July 19, 1977; U.S. Pat. No. 4,085,329 issued Apr. 18, 1978; U.S. Pat. No. 4,185,202 issued Jan. 22, 1980; U.S. Pat. No. 4,187,431 issued Feb. 5, 1980; U.S. Pat. No. 4,215,192 issued July 29, 1980; U.S. Pat. No. 4,238,682 issued Dec. 9, 1980; U.S. Pat. No. 4,301,237 issued Nov. 17, 1981 and U.S. Pat. No. 4,335,313 issued Jan. 15, 1982.

SUMMARY OF THE INVENTION

Accordingly, an object of the present invention resides in the provision of a new and improved mask ring assembly which can be held in position during use in X-ray lithographic systems within acceptable distortion limits.

Briefly, this and other objects of the present invention are realized in a specific illustrated mask ring assembly which is characterized by a mask ring, a plurality of kinematic mounts for removably mounting said mask ring on an alignment cartridge, each of said kinematic mounts including a funnel-like shaped seat such as, for example, a conically or spherically shaped seat member and a mating ball-like shaped member, which may for example be spherically shaped, one of said members being part of the mask ring and the other of the members being mounted on an alignment cartridge. According to one aspect of the invention, vacuum means are provided for holding said members together. According to another aspect of the invention, radially compliant flexure means are provided for mounting said ball-like shaped members on said alignment cartridge.

There has thus been outlined rather broadly the more important features of the invention in order that the detailed description thereof that follows may be better understood, and in order that the present contribution to the art may be better appreciated. There are, of course, additional features of the invention which will be described hereinafter and which will form the subject of Claims appended hereto. Those skilled in the art will appreciate that the conception upon which the disclosure is based may readily be utilized as a basis for the designing of other assemblies for carrying out the several purposes of the invention. It is important, therefore, that the claims be regarded as improving such equivalent assemblies as do not depart from the spirit and scope of the invention.

DETAILED DESCRIPTION OF THE PRESENTLY PREFERRED EMBODIMENTS

Figure 1A:
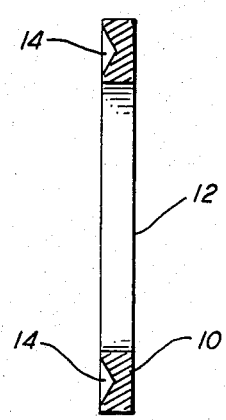
FIG. 1a is a sectional view taken along the line indicated at 1a—1a in FIG. 1.
Figure 1:
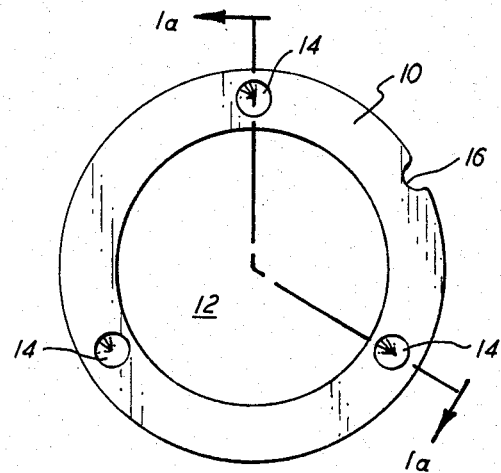
FIG. 1 is a bottom plan view of a mask ring.

FIG. 1 depicts a round, right, circular, mask ring 10, on the top surface of which is stretched a mask membrane 12. There are three spaced funnel-like shaped seats such as, for example, conically or spherically shaped seats 14 disposed on the bottom surface of said ring. The mask ring may be fabricated from any suitable material such as titanium or Pyrex, for example. The seats are fabricated in the ring.

To preclude large stresses and the accompanying strains resulting in mask distortion, the position of the three conical seats in the mask ring must be held to very tight, mechanical tolerances, such as, for example, of the order of about 0.0002 inches.

The mask pattern is etched on the mask membrane 12 by suitable means such as, for example, by an E-beam. The E-beam machine uses the top surface of the ring 10 and a notch or slot 16 for alignment purposes. These same references are also used in the fabrication of the mask ring assembly, thereby providing continuity of reference positions.

Figure 2:
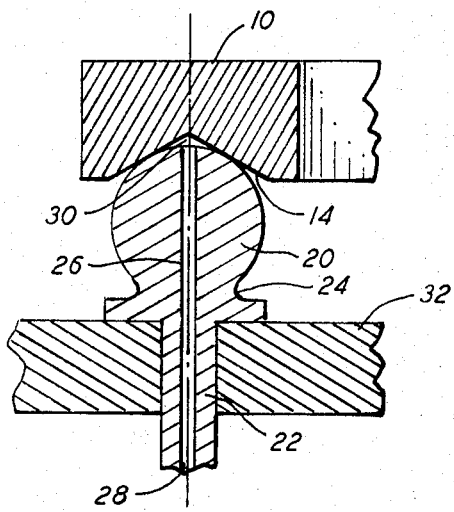
FIG. 2 is an enlarged, medial, vertical sectional view of a kinematic mount for mounting the mask ring of FIG. 1 on an alignment cartridge.
Figure 3:
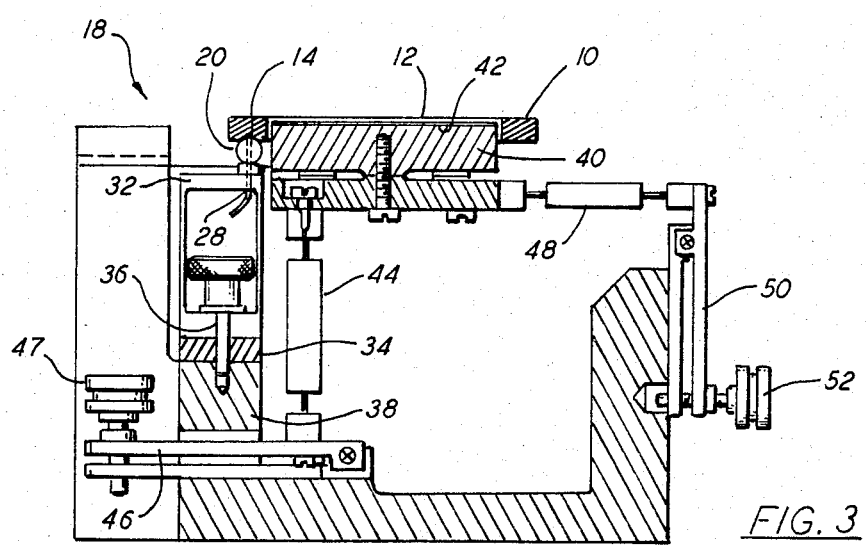
FIG. 3 is a medial, vertical section view of a mask ring assembly mounted on an alignment cartridge.

FIG. 2 shows a kinematic mount for removably mounting the mask ring 10 on an alignment cartridge indicated generally at 18 in FIG. 3. Preferably three such mounts are employed. Each includes the funnel-like shaped seat 14 and a mating ball-like shaped member 20, which may for example, be spherically shaped. In the embodiment illustrated in FIG. 2, the funnel-like shaped seat 14 is conically shaped. The angle of the cone is determined in such a way that preferential alignment treatment is given in a preferred direction. For example, if a straight cylinder is used there would be all horizontal or lateral alignment and no vertical alignment, and if a flat surface is used there would be all vertical alignment and no horizontal or lateral alignment. In the illustrated embodiment the cone has a total included angle of about 60°, thereby favoring the critical horizontal alignment, i.e. in the X and Y directions.

While the cone-shaped seat member could be carried by the cartridge and the ball member carried by the mask ring, FIG. 2 illustrates the reverse, i.e. the seats being located on the ring and the balls on the cartridge.

As seen in FIG. 2, the ball-like shaped member 20 is fixedly attached to a post 22, such as by means of friction welding at 24, for example. A hole or passage 26 is drilled in the ball and post, as by means of electrical discharge, for example. The outer end 28 of the passage 26 is connected to a source of vacuum and the inner end thereof is connected to a space or chamber 30 between the cone or seat member 14 and the ball 20. This is a sealed chamber and hence the vacuum serves to draw the seat member down on the ball with a positive repeatable force. It will be appreciated that cone or spherically shaped seats are used instead of v-blocks because in combination with the ball they form a small sealed chamber to which vacuum is applied to hold-down the seat with an accurate, repeatable force. This force is maintained through the various operations required in an X-ray lithographic system. If desired a positive pressure could be applied at the end 28 of the passage 26 to provide a separating force to the seat 14. It could also be used for cleaning purposes. The post 22 is fixedly attached to the cartridge as by means of a press fit into a bore in a radially compliant flexure 32.

Referring next to FIG. 3, the mask ring 10 is illustrated mounted on the cartridge 18, whereby the seats 14 are resting on the balls 20. Each sphere or ball 20 is mounted on a common plate 34 in the cartridge 18 via radially compliant flexures 32. That is, three balls and three cones are used which permit the use of vacuum to hold the mask ring in its correct position with minimum deformation and with the appropriate applied force. However, in view of the fact that three cones are used they provide overconstraint and as a result it is necessary to make the balls radially compliant to thereby provide the appropriate kinematic support without constraint. The compliant flexures 32 serve this purpose.

Still referring to FIG. 3, associated parts of the cartridge include screw means 36 for connecting the common plate 34 to the cartridge body 38. The common plate 34 is adjustable in the X and Y directions and for rotation about the vertical axis, to accommodate the misposition of the X-ray pattern with respect to the mask ring. The X-ray pattern can be very accurately generated, but the position of that accurately generated pattern can not be put down to a high degree of accuracy. In order not to run out of adjustment in the present system, a means for course or prealignment is provided. This is effected by positioning the common plate 34. Additionally, the cartridge incorporates a wafer chuck 40 for carrying a wafer 42. A vertical flexure 44 is connected to a lower portion of the wafer chuck 40 and a lever reduction mechanism 46 connects the vertical flexure 44 with an adjustment knob 47. Three spaced vertical flexures are positioned for controlling the fine adjustment of the wafer and its tilt in two directions and for controlling the proximity gap with respect to the mark position. In addition, a radial or horizontal flexure 48 is connected to a lever reduction mechanism 50, which is controlled by an adjusting knob 52, provided for the purpose. Three spaced horizontal flexures are incorporated for controlling the fine adjustment of the wafer in its lateral alignment in the X and Y directions and in its rotation about a vertical axis with respect to the mask.

It will thus be seen that the present invention does indeed provide a new and improved mask ring assembly for X-ray lithography which can be rigidly held in place during use within acceptable distortion limits, while imposing minimum stresses and strains on the ring, which limited distortions are highly repeatable in all degrees of freedom, and which is compatible with E-beam hardware and processes.

Although specific embodiments have been illustrated and described, it will be obvious to those skilled in the art that various modifications may be made without departing from the spirit and scope of the invention, which is to be limited solely by the appended claims.

What is claimed is:

1. In combination:
   a mask ring, a mask membrane having a mask pattern thereon mounted on said mask ring;
   an alignment cartridge;
   a plurality of kinematic mounts for removably mounting said mask ring on said alignment cartridge;
   each of said kinematic mounts including a funnel-like shaped seat member and a mating ball-like shaped member, one of said members being mounted on said mask ring and the other of said members being mounted on said alignment cartridge.

2. The combination according to claim 1 wherein said ball-like shaped members are mounted on said alignment cartridge and said funnel-like shaped seat members are fabricated in said mask ring.

3. The combination according to claim 1 wherein said plurality of kinematic mounts comprise three mounts spaced about 120° apart from each other.

4. The combination according to claim 1 wherein each of said ball-like shaped members have a fluid passage extending through it to its respective funnel-like shaped seat member.

5. The combination according to claim 1 further comprising radially compliant flexure means for mounting the other of said members on said alignment cartridge.

6. The combination according to claim 1 wherein said funnel-like shaped seat members are cone-shaped seat members.

7. The combination according to claim 6 wherein each of said cone-shaped seats has a total included angle of the order of about 60°.

8. The combination according to claim 1 wherein said funnel-like shaped seat members and said mating ball-like shaped members coact to form sealed chambers therebetween respectively, and said assembly further comprises means for forming a vacuum in said chambers to hold said members together.

9. The combination according to claim 1 wherein said mask ring has an alignment notch on the periphery thereof.

10. In combination:

a mask ring, a mask membrane having a mask pattern thereon mounted on said mask ring;

an alignment cartridge;

there kinematic mounts for removably mounting said mask ring on said alignment cartridge, said mounts being space about 120° apart from each other;

each of said kinematic mounts including a cone-shaped seat as part of said mask ring, each of said cone-shaped seats having a total included angle of the order of about 60°;

each of said kinematic mounts including a mating ball-like shaped member, radially compliant flexure means for mounting each of said ball-like shaped members on said alignment cartridge; and each of said cone-shaped seats and its mating ball-like shaped member coacting to form a sealed chamber there between, said ball-like shaped member having a fluid passage extending through it to said cone-shaped seat for forming a vacuum in said chamber to hold the members together.

11. The combination according to claim 10 wherein each of said ball-like shaped members is friction welded to a post and said post is fixedly attached to said radially compliant flexure means.

* * * * *